US012696585B2

(12) United States Patent
Funakoshi

(10) Patent No.: US 12,696,585 B2
(45) Date of Patent: Jul. 28, 2026

(54) NITRIDE SEMICONDUCTOR ELEMENT AND METHOD OF MANUFACTURING NITRIDE SEMICONDUCTOR ELEMENT

(71) Applicant: NICHIA CORPORATION, Anan (JP)

(72) Inventor: Ryota Funakoshi, Tokushima (JP)

(73) Assignee: NICHIA CORPORATION, Anan (JP)

( * ) Notice: Subject to any disclaimer, the term of this patent is extended or adjusted under 35 U.S.C. 154(b) by 414 days.

(21) Appl. No.: 18/498,880

(22) Filed: Oct. 31, 2023

(65) Prior Publication Data

US 2024/0063332 A1 Feb. 22, 2024

Related U.S. Application Data

(63) Continuation of application No. 17/470,876, filed on Sep. 9, 2021, now Pat. No. 11,843,075.

(30) Foreign Application Priority Data

Sep. 11, 2020 (JP) ................................. 2020-153275

(51) Int. Cl.
| | |
|---|---|
| *H01L 33/62* | (2010.01) |
| *H10H 20/01* | (2025.01) |
| *H10H 20/81* | (2025.01) |
| *H10H 20/813* | (2025.01) |
| *H10H 20/825* | (2025.01) |

(52) U.S. Cl.
CPC .. *H10H 20/8215* (2025.01); *H10H 20/01335* (2025.01); *H10H 20/0137* (2025.01); *H10H 20/813* (2025.01); *H10H 20/825* (2025.01)

(58) Field of Classification Search
CPC ....... H01L 33/62; H01L 33/502; H01L 33/60; H01L 25/0753
See application file for complete search history.

(56) References Cited

U.S. PATENT DOCUMENTS

| | | | |
|---|---|---|---|
| 11,211,525 B2 | 12/2021 | Rajan et al. | |
| 11,476,386 B2 | 10/2022 | Wildeson et al. | |
| (Continued) | | | |

FOREIGN PATENT DOCUMENTS

| | | | |
|---|---|---|---|
| JP | 2004-128502 A | 4/2004 | |
| JP | 2005-019874 A | 1/2005 | |
| (Continued) | | | |

*Primary Examiner* — Trang Q Tran
(74) *Attorney, Agent, or Firm* — Foley & Lardner LLP

(57) ABSTRACT

A method of manufacturing a nitride semiconductor element includes: providing a first light emission part comprising a first n-side semiconductor layer, a first active layer formed on the first n-side semiconductor layer, and a first p-side semiconductor layer formed on the first active layer; forming a first layer such that the first layer contains an n-type impurity of a first concentration; forming a second layer such that the second layer contains an n-type impurity of a second concentration lower than the first concentration, wherein a thickness of the second layer is greater than a thickness of the first layer; and forming a second light emission part comprising: a second n-side semiconductor layer such that the second n-side semiconductor layer contains an n-type impurity of a third concentration lower than the first concentration and the second concentration, a second active layer, and a second p-side semiconductor layer.

18 Claims, 9 Drawing Sheets

(56)     References Cited

U.S. PATENT DOCUMENTS

| | | | |
|---|---|---|---|
| 2004/0066816 A1 | 4/2004 | Collins et al. | |
| 2006/0097269 A1 | 5/2006 | Lester | |
| 2018/0342646 A1 | 11/2018 | Uzawa et al. | |
| 2019/0074404 A1 | 3/2019 | Young et al. | |
| 2019/0259908 A1 | 8/2019 | Uzawa et al. | |
| 2020/0343412 A1 | 10/2020 | Hayashi | |
| 2020/0350477 A1* | 11/2020 | Shim | H10H 20/8312 |
| 2020/0365647 A1 | 11/2020 | Jang et al. | |
| 2021/0020686 A1 | 1/2021 | Kishino | |
| 2021/0202790 A1 | 7/2021 | Hayashi | |
| 2021/0305451 A1 | 9/2021 | Kishino | |

FOREIGN PATENT DOCUMENTS

| | | | |
|---|---|---|---|
| JP | 2006-108600 A | 4/2006 | |
| JP | 2008-078297 A | 4/2008 | |
| JP | 2008-518440 A | 5/2008 | |
| JP | 2019-522356 A | 8/2019 | |
| KR | 2018-0129648 A | 12/2018 | |
| WO | WO-2017/201363 A1 | 11/2017 | |

* cited by examiner

*Fig.2E*

NITRIDE SEMICONDUCTOR ELEMENT AND METHOD OF MANUFACTURING NITRIDE SEMICONDUCTOR ELEMENT

CROSS-REFERENCE TO RELATED APPLICATIONS

This application is a continuation of U.S. patent application Ser. No. 17/470,876, filed on Sep. 9, 2021, which claims priority to Japanese Patent Application No. 2020-153275, filed on Sep. 11, 2020. The disclosures of these applications are hereby incorporated by reference in their entireties.

BACKGROUND

The present disclosure relates to a nitride semiconductor element and a method of manufacturing a nitride semiconductor element.

In recent years, the development of a nitride semiconductor element having a tunnel junction has been actively pursued. For example, Japanese Patent Publication No. 2019-522356 discloses a method of manufacturing a nitride semiconductor element that includes a group III nitride semiconductor layer having a tunnel junction.

SUMMARY

The forward voltage of such a nitride semiconductor element that includes a nitride semiconductor layer having a tunnel junction tends to be high.

One object of the present disclosure is to provide a nitride semiconductor element whose forward voltage is reduced, and a method of manufacturing such a nitride semiconductor element.

According to one embodiment, a nitride semiconductor element comprises: a first light emission part that includes a first n-side semiconductor layer, a first active layer formed on the first n-side semiconductor layer, and a first p-side semiconductor layer formed on the first active layer; a first layer that contains an n-type impurity of a first concentration, is formed on the first light emission part, and is in contact with the first p-side semiconductor layer; a second layer that contains an n-type impurity of a second concentration, is formed on the first layer, a second light emission part that includes a second n-side semiconductor layer formed on the second layer, a second active layer formed on the second n-side semiconductor layer, and a second p-side semiconductor layer formed on the second active layer; wherein the second n-side semiconductor layer contains an n-type impurity of a third concentration, the first concentration and the second concentration are higher than the third concentration, the first concentration is higher than the second concentration, and a thickness of the second layer is larger than a thickness of the first layer.

According to another embodiment, a method of manufacturing a nitride semiconductor element comprises: providing a first light emission part, the first emission part including a first n-side semiconductor layer, a first active layer formed on the first n-side semiconductor layer, and a first p-side semiconductor layer formed on the first active layer; forming a first layer containing an n-type impurity on the first p-side semiconductor layer, which comprises introducing an n-type impurity of a first concentration; forming a second layer on the first layer, which comprises introducing an n-type impurity of a second concentration lower than the first concentration to the second layer having a larger thickness than a thickness of the first layer; and forming a second light emission part. The second light emission part includes: a second n-side semiconductor layer containing an n-type impurity of a third concentration lower than the first concentration and the second concentration, and formed on the second layer; a second active layer formed on the second n-side semiconductor layer; and a second p-side semiconductor layer formed on the second active layer.

According to a nitride semiconductor element and a method of manufacturing a nitride semiconductor element of certain embodiments of the present disclosure, a nitride semiconductor element whose forward voltage is reduced, as well as a method of manufacturing the same, can be provided.

BRIEF DESCRIPTION OF THE DRAWINGS

FIG. 2E is a schematic cross-sectional view of a state in the manufacturing process for the nitride semiconductor element shown in FIG. 1.

DETAILED DESCRIPTION

Figure 1:
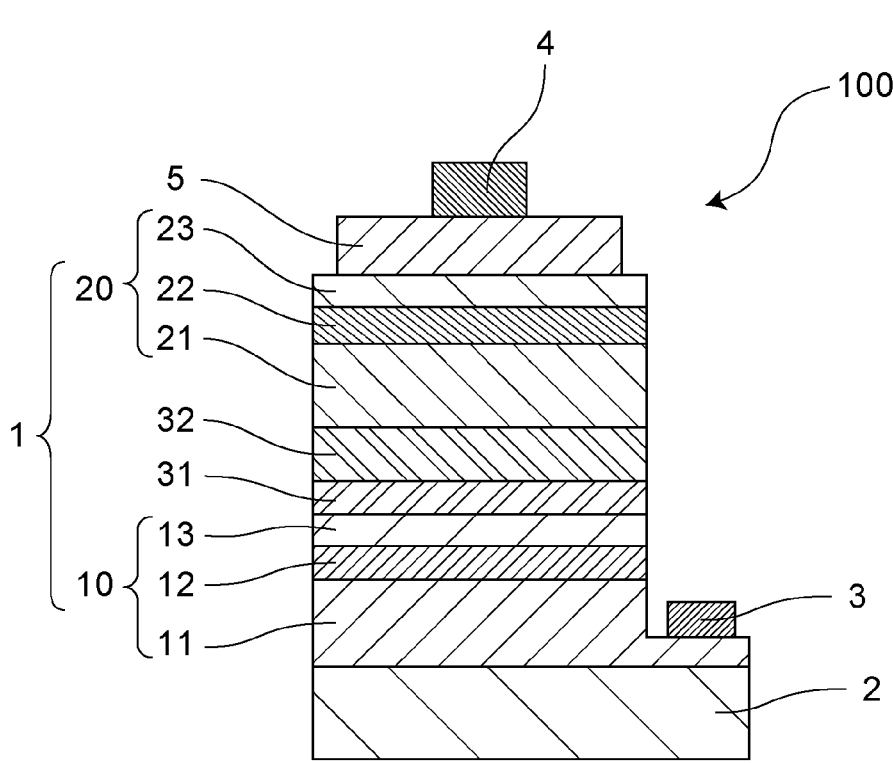
FIG. 1 is a cross-sectional view of a nitride semiconductor element according to an embodiment of the present disclosure.

Certain embodiments and examples of the present disclosure will be explained below with reference to the accompanying drawings. The nitride semiconductor elements and the methods of manufacturing the nitride semiconductor elements described below are for giving shape to the technical ideas of the present invention, and the present invention is not limited to the described embodiments unless specifically noted.

In the drawings, members having the same functions may be denoted by the same reference numerals. Focusing on the main points and considering ease of understanding, constituent elements may be described in a certain embodiment or example, but may be partially substituted or combined with those described in different embodiments and examples. The explanation of the features already discussed in a previous embodiment or example may be omitted in later embodiments or examples, and only the differences from the earlier embodiment or example may be explained. Specifically, similar effects achieved by similar constituents will not be repeated for each embodiment. The sizes and the relative positions of the members in the drawings may be exaggerated for clarity of explanation.

A nitride semiconductor element and a method of manufacturing a nitride semiconductor element according to certain embodiments will be described below with reference to the drawings.

A nitride semiconductor element 100 according to one embodiment, as shown in FIG. 1, includes a substrate 2, a semiconductor structure 1 disposed on the substrate 2, a first electrode 3, and a second electrode 4.

The semiconductor structure 1 according to this embodiment includes a first light emission part 10, a second light emission part 20, a first layer 31 containing an n-type impurity of a first concentration disposed between the first light emission part 10 and the second light emission part 20, and a second layer 32 containing an n-type impurity of a second concentration disposed between the first layer 31 and the second light emission part 20.

The first light emission part 10 includes a first n-side semiconductor layer 11 formed on the substrate 2, a first active layer 12 formed on the first n-side semiconductor layer 11, and a first p-side semiconductor layer 13 formed on the first active layer 12. A first electrode 3 is electrically connected to the first n-side semiconductor layer 11.

The first layer 31 is disposed on the first p-side semiconductor layer 13 in contact with the first p-side semiconductor layer 13. The first layer 31 contains a n-type impurity of a first concentration.

The second layer 32 is disposed on the first layer 31. The second layer 32 contains an n-type impurity of a second concentration lower than the first concentration. The thickness of the second layer 32 is larger than the thickness of the first layer 31.

The second light emission part 20 includes a second n-side semiconductor layer 21 disposed on the first layer 31, a second active layer 22 disposed on the second n-side semiconductor layer 21, and a second p-side semiconductor layer 23 disposed on the second active layer 22. The second n-side semiconductor layer 21 contains an n-type impurity of a third concentration. The third concentration is lower than the first concentration and the second concentration. A second electrode 4 is electrically connected to the second p-side semiconductor layer 23 via a conductive layer 5.

The nitride semiconductor element 100 according to this embodiment can be used as either a face-up or flip-chip mounted nitride semiconductor element. In the case of a flip-chip mounted element, the light emitted by the first active layer 12 and the second active layer 22 is extracted through the substrate 2. In other words, the first electrode 3 and the second electrode 4 are provided on the same side, and the emitted light from the first active layer 12 and the second active layer 22 can be extracted from the side that has no electrodes.

The nitride semiconductor element 100 will be explained in detail below.

Substrate

The materials that can be employed as the substrate 2 include sapphire, Si, SiC, GaN, or the like. A buffer layer may be interposed between the substrate 2 and the first n-side semiconductor layer 11.

First Light Emission Part

The first light emission part 10 in which a plurality of semiconductor layers formed of nitride semiconductors are stacked includes a first n-side semiconductor layer 11, a first active layer 12, and a first p-side semiconductor layer 13. Nitride semiconductors can include all compositions resulting by varying the composition ratio x and y within their respective ranges in the chemical formula represented by $In_xAl_yGa_{1-x-y}N$ ($0 \leq x \leq 1$, $0 \leq y \leq 1$, $x+y \leq 1$). In the first light emission part 10, the first n-side semiconductor layer 11, the first active layer 12, and the first p-side semiconductor layer 13 are successively disposed in that order from the substrate 2 side.

First n-Side Semiconductor Layer

The first n-side semiconductor layer 11 has, for example, a nitride semiconductor layer containing an n-type impurity, such as silicon (Si), germanium (Ge), or the like. The first n-side semiconductor layer 11 includes one or more n-type nitride semiconductor layers. The first n-side semiconductor layer 11 may include an undoped semiconductor layer as a part. Here, an undoped semiconductor layer is a layer to which no n-type or p-type impurity is intentionally added. The n-type or p-type impurity concentration of an undoped semiconductor layer is, for example, below the detection limit of certain analysis methods, such as SIMS (secondary ion mass spectroscopy) or the like. In the case in which an undoped semiconductor layer contains, for example, Si as an n-type impurity, the n-type impurity concentration is $1 \times 10^{16}$ $cm^{-3}$ or less. In the case in which an undoped semiconductor layer contains, for example, Ge as an n-type impurity, the n-type impurity concentration is $1 \times 10^{17}$ $cm^{-3}$ or less.

The first n-side semiconductor layer 11 can include, for example, an n-type GaN layer, and the thickness of the n-type GaN layer can be set as 5 μm to 15 μm. In the case in which the n-type GaN layer contains Si as an n-type impurity, the impurity concentration of the n-type GaN layer is, for example, $1 \times 10^{18}$ $cm^{-3}$ or more and $1 \times 10^{19}$ $cm^{-3}$ or less.

First Active Layer

The first active layer 12 disposed between the first n-side semiconductor layer 11 and the first p-side semiconductor layer 13 includes a light emission layer. The first active layer 12, for example, is a nitride semiconductor layer that emits light in the 365 nm to 760 nm peak emission wavelength range. The first active layer 12, for example, has a multiple quantum well structure having a plurality of well layers and a plurality of barrier layers. In the case in which the first active layer 12 has a quantum well structure that emits light in the wavelength range described above, the well layers are GaN or InGaN, for example, and the barrier layers are AlGaN or GaN, for example.

First p-Side Semiconductor Layer

The first p-side semiconductor layer 13 has a nitride semiconductor layer that contains a p-type impurity such as magnesium (Mg). The first p-side semiconductor layer 13 includes one or more p-type nitride semiconductor layers. In order to form a tunnel junction with the first layer 31 described later, at least the layer that is in contact with the first layer 31 is preferably a nitride semiconductor layer containing a p-type impurity. The nitride semiconductor making up the p-type nitride semiconductor layer is, for example, a p-type GaN layer, and may contain In and/or Al. The thickness of the p-type GaN layer can be in a range of 0.04 μm to 0.2 μm. When the p-type GaN layer contains Mg as a p-type impurity, the impurity concentration of the p-type GaN layer can be set as $1 \times 10^{19}$ $cm^{-3}$ to $3 \times 10^{20}$ $cm^{-3}$, for example. The first p-side semiconductor layer 13 may include an undoped semiconductor layer, for example.

First Layer

The first layer 31 is a nitride semiconductor layer containing an n-type impurity, such as Si, Ge, or the like. The first layer 31 is formed in contact with the first p-side semiconductor layer 13. The first layer 31 is, for example, an n-type GaN layer, and may contain In and/or Al.

The n-type impurity concentration (first concentration) of the first layer 31 is higher than the n-type impurity concentration (second concentration) of the second layer 32 described later. The first concentration, furthermore, is higher than the n-type impurity concentration (third concentration) of the second n-side semiconductor layer 21 described later. The first concentration of the first layer 31 may be $2\times10^{20}$ $cm^{-3}$ to $1\times10^{22}$ $cm^{-3}$, for example. The forward voltage can be reduced by setting the first concentration to fall within this range. The first concentration is preferably $2\times10^{20}$ $cm^{-3}$ to $1\times10^{21}$ $cm^{-3}$, more preferably $2\times10^{20}$ $cm^{-3}$ to $5\times10^{20}$ $cm^{-3}$. This can reduce the degradation of the crystallinity of the first layer 31 attributable to a high impurity concentration, thereby hindering the characteristics of the nitride semiconductor element from degrading. The first concentration is, for example, 1.5 times or more and 100 times or less of the maximum value of the second concentration described later, preferably 1.5 times or more and 75 times or less, more preferably 2 times or more and 50 times or less.

Second Layer

The second layer 32 is a nitride semiconductor layer that is in contact with the first layer 31, and contains an n-type impurity. N-type impurities include Si, Ge, or the like. The second layer 32 is, for example, an n-type GaN layer, and may contain In and/or Al. The second layer 32 is also in contact with the second n-side semiconductor layer 21.

The n-type impurity concentration (second concentration) of the second layer 32 is lower than the first concentration of the first layer 31. The second concentration, for example, is in a range of 0.09 to 0.38 times the first concentration. The second concentration is, for example, in a range of 0.09 to 0.38 times the maximum value of the first concentration. The second concentration of the second layer 32 is higher than the n-type impurity concentration (third concentration) of the second n-side semiconductor layer 21. The second concentration is lower than the first concentration, for example, $1\times10^{19}$ $cm^{-3}$ to $2\times10^{20}$ $cm^{-3}$.

The first layer 31 and the second layer 32 form a p-n junction with the first p-side semiconductor layer 13. Here, the p-n junction formed by the first layer 31 and the second layer 32 with the first p-side semiconductor layer 13 in this embodiment can form a so-called tunnel junction. A tunnel junction can be formed by making at least either the p-type impurity concentration of the p-type semiconductor layer or the n-type impurity concentration of the n-type semiconductor layer high. In the tunnel junction, the width of the depletion layer formed by the p-n junction formed by the first layer 31 and the second layer 32 with the first p-side semiconductor layer 13 is preferably small in order to increase the probability of electrons passing through the depletion layer. The higher the concentration of the p-type impurity concentration and/or the n-type impurity concentration, the smaller the width of the depletion layer can become. Accordingly, in this embodiment, the width of the depletion layer formed by the p-n junction is made relatively small by allowing the first layer 31 to have a high concentration of the n-type impurity, thereby facilitating the passage of electrons through the depletion layer.

Because the first layer 31 is an n-type nitride semiconductor layer of a high impurity concentration, it can be difficult to form a sufficiently thick first layer 31 while maintaining the crystallinity. A first layer 31 having an insufficient thickness results in low amount of the n-type impurity contained in the first layer 31, thereby expanding the depletion layer. Accordingly, a second layer 32, having a second concentration lower than the first concentration and a larger thickness than the first layer 31, is disposed in contact with the first layer 31. Such a second layer can be a supply source of electrons that might run short if supplied only by the first layer 31. Because the second concentration is lower than the first concentration, the amount of the n-type impurity contained in the second layer 32 per unit volume is smaller than that in the first layer 31. Making the second layer 32 thicker than the first layer 31 can increase the volume of the second layer 32 to allow a larger number of electrons to be utilized in the tunnel junction formation. Accordingly, the forward voltage of the nitride semiconductor element can be reduced because the first layer 31, the second layer 32, and the first p-side semiconductor layer 13 can form a tunnel junction having a small width depletion layer.

Furthermore, the effect explained below can be expected when the second layer 32 has a larger thickness than the first layer 31. It is believed that if the p-type impurity in the first p-side semiconductor layer is diffused in the second n-side semiconductor layer 21 and/or the second active layer 22, the width of the depletion layer would expand, thereby reducing the probability of the passage of electrons through the depletion layer. Disposing the second layer 32 on the first layer 31 increases the distance between the first p-side semiconductor layer 13 and the second n-side semiconductor layer 21 and/or the second active layer 22. This can increase the distance for the diffusion of the p-type impurity contained in the first p-side semiconductor layer 13 into the second n-side semiconductor layer 21 and/or the second active layer 22, thereby hindering the p-type impurity from diffusing in the second n-side semiconductor layer 21 and/or the second active layer 22. This can reduce the expansion of the depletion layer width, thereby increasing the probability of the passage of electrons through the depletion layer. The increased probability of the passage of electrons through the depletion layer can increase the number of electrons contributing to the light emission, thereby increasing the light output.

Disposing the second layer 32 having a second concentration lower than the first concentration can improve the crystallinity and the surface morphology of the second layer 32 as compared to the first layer 31, thereby allowing the second light emission part 20 to be formed with a higher degree of crystallinity.

In an embodiment of the present disclosure, the thickness of the first layer 31 is smaller than the thickness of the second layer 32. This can reduce the forward voltage of the nitride semiconductor element 100 that includes a first light emission part 10 and a second light emission part 20. The thickness of the second layer 32 is, for example, 5 to 60 times, preferably 5 to 25 times the thickness of the first layer 31. This can further reduce the forward voltage. The thickness of the first layer 31 is, for example, 1 nm to 10 nm, preferably 1 nm to 6 nm, more preferably 1 nm to 5 nm, more preferably 1 nm to 4 nm. The thickness of the first layer 31 is particularly preferably 1 nm to 3 nm. This can further reduce the forward voltage. The thickness of the second layer 32 is, for example, 15 nm to 60 nm. This can further reduce the forward voltage. The thickness of the first layer 31, for example, can be analyzed in detail by combinational analyze using STEM (scanning transmission electron microscope) and EDS (energy dispersive X-ray spectroscopy).

In the case in which the thickness of the first layer 31 is 1 nm to 3 nm, the thickness of the second layer 32 is preferably 15 nm to 50 nm. The thickness of the second layer 32 is more preferably 20 nm to 45 nm. Setting the thicknesses of the first layer 31 and the second layer 32 to fall within these ranges can reduce the width of the depletion layer, thereby reducing the forward voltage and increasing the light output.

The sum of the thicknesses of the first layer 31 and the second layer 32 is preferably 20 nm to 50 nm, more preferably 30 nm to 45 nm. This can reduce the width of the depletion layer, thereby reducing the forward voltage and increasing the light output.

The thicknesses of the first layer 31 and the second layer 32 and their ratio can be estimated by conducting a quantitative analysis on the impurity concentrations by SIMS. The n-type impurity concentration of the first layer 31 is higher than the n-type impurity concentration of the second layer 32, and the second layer 32 is a layer that has a higher n-type impurity concentration than the second n-side semiconductor layer. Accordingly, by conducting a SIMS analysis, one can observe the portions corresponding to the first layer 31, the second layer 32, and the second n-side semiconductor layer in descending order of the relative n-type impurity concentrations. The n-type impurity concentrations of the first layer 31 and the second layer 32 might change steeply or gradually at the beginning or the end of each layer. In the case of the latter, the region in which the n-type impurity concentration falls within a predetermined range can be estimated as the first layer 31 or the second layer 32. For example, the first layer 31 can be estimated as the portion where the n-type impurity concentration falls within the $2 \times 10^{20}$ cm$^{-3}$ to $1 \times 10^{21}$ cm$^{-3}$ range, and the second layer 32 as the portion where the n-type impurity concentration falls within the $1 \times 10^{19}$ cm$^{-3}$ to $2 \times 10^{20}$ cm$^{-3}$ range. A quantitative analysis of a p-type impurity concentration can also be conducted by SIMS. The p-type impurity concentration of the second layer 32 can be set to be lower than the p-type impurity concentration of the first layer 31. The p-type impurity concentration of the second layer 32 may be, for example, in a range of 0.005 to 0.2 times the peak p-type impurity concentration of the first p-side semiconductor layer 13. The p-type impurity concentration of the second layer 32 specifically is, for example, $1 \times 10^{18}$ cm$^{-3}$ to $4 \times 10^{19}$ cm$^{-3}$.

Next, the relationship between the second layer 32 and the second n-side semiconductor layer 21 described later will be explained. The second concentration of the second layer 32 is higher than the n-type impurity concentration (third concentration) of the second n-side semiconductor layer 21. This, similar to the first layer 31, allows the second layer to supply carriers (electrons) to the second active layer 22 when the current is applied into the nitride semiconductor element 100. This can reduce the forward voltage of the nitride semiconductor element 100.

Second Light Emission Part

The second light emission part 20 in which a plurality of semiconductor layers formed of nitride semiconductors are stacked includes a second n-side semiconductor layer 21, a second active layer 22, and a second p-side semiconductor layer 23. Nitride semiconductors can include all compositions resulting by varying the composition ratio x and y within their respective ranges in the chemical formula represented by In$_x$Al$_y$Ga$_{1-x-y}$N ($0 \leq x \leq 1$, $0 \leq y \leq 1$, $x+y \leq 1$). In the semiconductor stack body, the second n-side semiconductor layer 21, the second active layer 22, and the second p-side semiconductor layer 23 are successively disposed in that order from the substrate 2 side.

Second n-Side Semiconductor Layer

The second n-side semiconductor layer 21 is in contact with the second layer 32 and the second active layer 22, and has, for example, a nitride semiconductor layer doped with an n-type impurity such as Si, Ge, or the like. The second n-side semiconductor layer 21 includes one or more n-type nitride semiconductor layers. The second n-side semiconductor layer 21 may include an undoped semiconductor layer as a part.

The n-type impurity concentration (third concentration) of the second n-side semiconductor layer 21 is lower than the n-type impurity concentration (first concentration) of the first layer 31. The third concentration of the second n-side semiconductor layer 21 is lower than the n-type impurity concentration (second concentration) of the second layer 32. The third concentration refers to the highest concentration in the second n-side semiconductor layer. The third concentration is lower than the first concentration and the second concentration, for example, $1 \times 10^{18}$ cm$^{-3}$ to $2 \times 10^{19}$ cm$^{-3}$. The thickness of the second n-side semiconductor layer 21 can also be estimated by a SIMS analysis similar to the first layer 31 and the second layer 32. The p-type impurity concentration of the second n-side semiconductor layer 21 can similarly be estimated by a SIMS analysis. The p-type impurity concentration of the second n-side semiconductor layer 21 can be set to be lower than the p-type impurity concentration of the second layer 32. The p-type impurity concentration of the second n-side semiconductor layer 21 may be, for example, in a range of 0.002 to 0.045 times the peak p-type impurity concentration of the first p-side semiconductor layer 13. The p-type impurity concentration of the second n-side semiconductor layer 21 specifically is, for example, $4 \times 10^{17}$ cm$^{-3}$ to $9 \times 10^{18}$ cm$^{-3}$.

The thickness of the second n-side semiconductor layer 21 is larger than that of the first layer 31. The thickness of the second n-side semiconductor layer 21 is larger than that of the second layer 32. The thickness of the second n-side semiconductor layer 21 is, for example, in a range of 0.03 μm to 0.2 μm.

Second Active Layer

The second active layer 22 is disposed between the second n-side semiconductor layer 21 and the second p-side semiconductor layer 23, and includes an light emission layer. The second active layer 22 is, for example, a nitride semiconductor layer emitting light having the peak emission wavelength in the 365 nm to 760 nm range. The second active layer 22 has a multiple quantum well structure having a plurality of well layers and a plurality of barrier layers. In the case in which the second active layer 22 has a quantum well structure that emits light in the wavelength range described above, the well layers are GaN or InGaN, for example, and the barrier layers are AlGaN or GaN, for example.

The second active layer 22 might contain a p-type impurity attributable to unintended diffusion of the p-type impurity. The p-type impurity concentration of the second active layer 22 can also be estimated by a SIMS analysis similar to the second n-side semiconductor layer 21. The p-type impurity concentration of the second active layer 22 may be, for example, in a range of 0.0015 to 0.015 times the peak p-type impurity concentration of the first p-side semiconductor layer 13. The p-type impurity concentration of the second active layer 22 specifically is, for example, $3 \times 10^{17}$ cm$^{-3}$ to $3 \times 10^{18}$ cm$^{-3}$.

The color of the light emitted by the second active layer 22 may be the same as or different from the color of the light emitted by the first active layer 12. When the color of light emitted by the first active layer 12 is the same as that of the light emitted by the second active layer 22, the per unit area output of the same color light can be increased as compared to a light emitting element having a single active layer, and is thus preferable. For example, the nitride semiconductor element 100 according to an embodiment of the present disclosure emits blue or green light. In the description here, blue light refers to light having a peak emission wavelength falling within the 435 nm to 460 nm range, and green light refers to light having a peak emission wavelength falling within the 500 nm to 560 nm range.

Second p-Side Semiconductor Layer

The second p-side semiconductor layer 23, for example, has a nitride semiconductor layer containing a p-type impurity such as Mg. The second p-side semiconductor layer 23 includes one or more p-type nitride semiconductor layers. The nitride semiconductor making up the p-type nitride semiconductor is, for example, p-type GaN, and may contain In and/or Al. The thickness of a p-type GaN layer can be in a range of 0.04 μm to 0.2 μm. In the case in which the p-type GaN layer contains Mg as a p-type impurity, the impurity concentration of the p-type GaN layer can be set to be $1 \times 10^{19}$ cm$^{-3}$ to $3 \times 10^{20}$ cm$^{-3}$. The second p-side semiconductor layer 23 may include, for example, an undoped semiconductor layer as a part.

First Electrode and Second Electrode

In this embodiment, the first electrode 3 is formed on the first n-side semiconductor layer 11. The first electrode 3 is electrically connected to the first n-side semiconductor layer 11.

In this embodiment, the second electrode 4 is electrically connected to the second p-side semiconductor layer 23 via a conducive layer 5 formed on the second p-side semiconductor layer 23.

Manufacturing Method

Next, an example of a method of manufacturing a nitride semiconductor element 100 according to the embodiment will be explained. The nitride semiconductor element 100 is manufactured by MOCVD (metal organic chemical vapor deposition) in a pressure and temperature adjustable chamber. Each nitride semiconductor layer can be formed by introducing a carrier gas and a source gas into the chamber. For the carrier gas, hydrogen (H$_2$) or nitrogen (N$_2$) gas can be used. Ammonia (NH$_3$) gas can be used as a nitrogen source. Trimethylgallium (TMG) or triethylgallium (TEG) gas can be used as a Ga source gas. Trimethylindium (TMI) gas can be used as an In source gas. Trimethylaluminum (TMA) gas can be used as an Al source gas. Monosilane (SiH$_4$) gas can be used as a Si source gas. Bis(cyclopentadienyl)magnesium (Cp$_2$Mg) gas can be used as a Mg source gas. The example of manufacturing method described below is a method in which each layer is epitaxially grown by MOCVD.

Providing Substrate

Figure 2A:
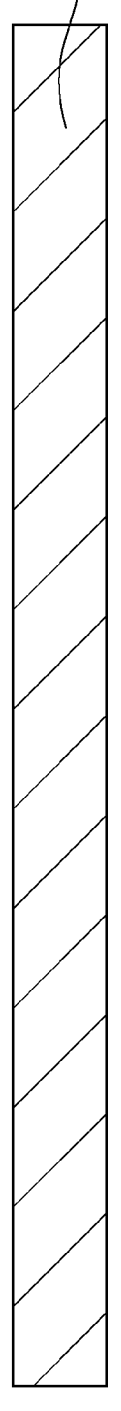
FIG. 2A is a schematic cross-sectional view of a state in a manufacturing process for the nitride semiconductor element shown in FIG. 1.

First, as shown in FIG. 2A, a substrate 2 formed of, for example, sapphire is provided.

Providing First Light Emission Part

Figure 2B:
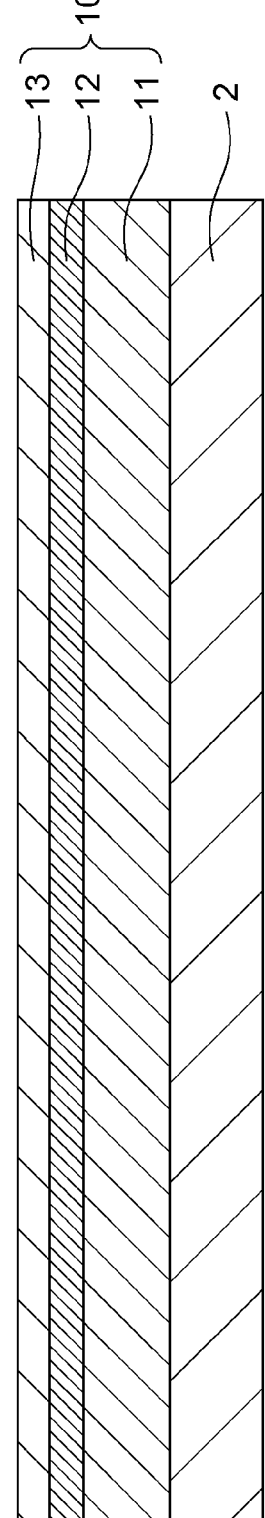
FIG. 2B is a schematic cross-sectional view of a state in the manufacturing process for the nitride semiconductor element shown in FIG. 1.

Subsequently, as shown in FIG. 2B, a first light emission part 10 is formed on the substrate 2.

For the first light emission part 10, a first n-side semiconductor layer 11 is formed on the substrate 2. The first n-side semiconductor layer 11 is formed, for example, by growing successively from the substrate 2 side an n-type contact layer and an n-type clad layer. The first n-side semiconductor layer 11 may be formed after forming a buffer layer on the substrate 2. An undoped semiconductor layer may further be disposed between the buffer layer and the n-type contact layer.

Subsequently, on the first n-side semiconductor layer 11, a first active layer 12 is formed. In the case of a first active layer 12 having a multiple quantum well structure, for example, the first active layer 12 can be formed on the substrate 2 by alternately forming barrier layers and well layers as many times as desired. In this case, the process for forming the first active layer 12 is completed with a barrier layer forming process.

Subsequently, on the first active layer 12, a first p-side semiconductor layer 13 is formed by growing, for example, a p-type clad layer.

By following these processes, a first light emission part 10 that has a first n-side semiconductor layer 11, a first active layer 12, and a first p-side semiconductor layer 13 is provided on the substrate 2.

Forming First Layer

Figure 2C:
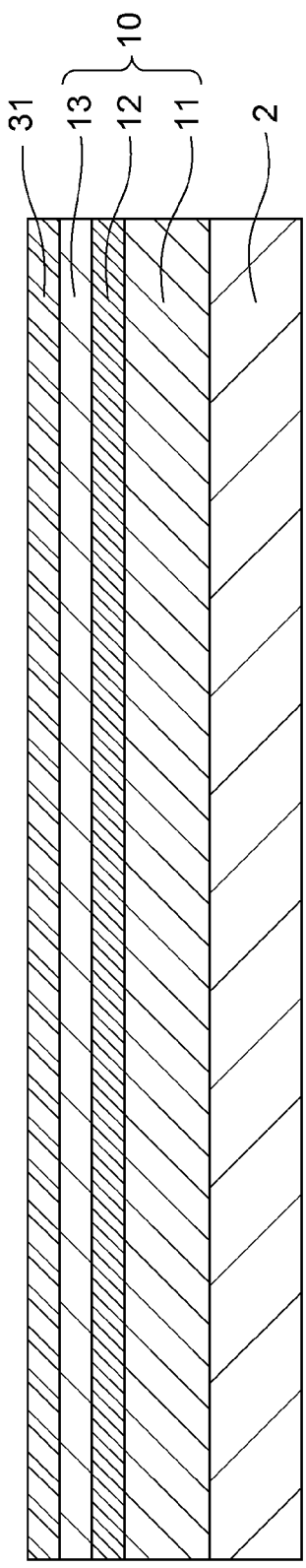
FIG. 2C is a schematic cross-sectional view of a state in the manufacturing process for the nitride semiconductor element shown in FIG. 1.

Subsequently, as shown in FIG. 2C, on the first p-side semiconductor layer 13, a first layer 31 containing an n-type impurity of a first concentration is formed. The first layer 31, for example, is n-type GaN, and may contain In and/or Al. The first concentration, for example, is $2 \times 10^{20}$ cm$^{-3}$ to $1 \times 10^{22}$ cm$^{-3}$, preferably $2 \times 10^{20}$ cm$^{-3}$ to $1 \times 10^{21}$ cm$^{-3}$, more preferably $2 \times 10^{20}$ cm$^{-3}$ to $5 \times 10^{20}$ cm$^{-3}$.

The first layer 31 containing an n-type impurity of a first concentration can be formed by introducing a carrier gas, a source gas for forming the first layer 31, and a source gas containing an element for the n-type impurity. In the case of using Si as the n-type impurity, for example, by supplying a source gas containing Si into a source gas for forming the first layer 31 at a predetermined flow rate, the first layer 31 containing the n-type impurity of the first concentration can be formed. At this time, for example, the first molar ratio of Si to Ga in the source gas (first Si/Ga ratio) may be in a range of $1.1 \times 10^{-2}$ to $1.6 \times 10^{-2}$.

The thickness of the first layer 31 is preferably smaller than that of the second layer 32, and smaller than that of the second n-side semiconductor layer 21. The first layer 31 is formed to a thickness, for example, in a range of 1 nm to 10 nm.

Forming Second Layer

Figure 2D:
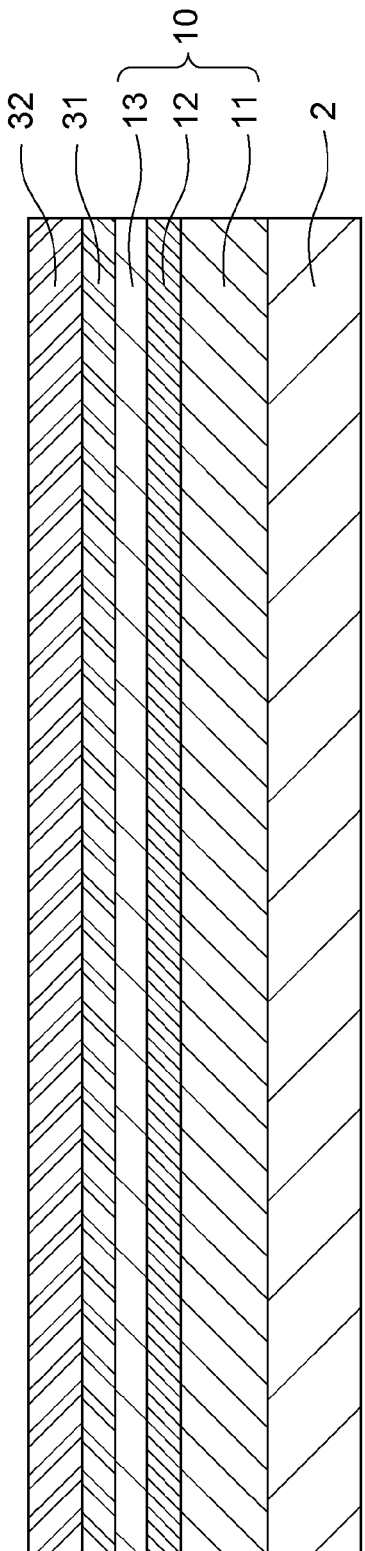
FIG. 2D is a schematic cross-sectional view of a state in the manufacturing process for the nitride semiconductor element shown in FIG. 1.

Subsequently, as shown in FIG. 2D, on the first layer 31, a second layer 32 containing an n-type impurity of a second concentration is grown. The second layer 32, for example, is n-type GaN, and may contain In and/or Al. The second concentration, for example, is in a range of $2 \times 10^{19}$ cm$^{-3}$ to $2 \times 10^{20}$ cm$^{-3}$.

The second layer 32 containing an n-type impurity of a second concentration can be formed by incorporating an n-type impurity into a source gas for forming the second layer 32. In the case of using Si as the n-type impurity, for example, by supplying a source gas containing Si into a source gas for forming the second layer 32 at a predetermined flow rate, the second layer 32 containing the n-type impurity of the second concentration can be formed. At this time, for example, the second molar ratio of Si to Ga in the source gas (second Si/Ga ratio) is set lower than the first molar ratio. The second molar ratio is lower than the first molar ratio, and may be set to fall within a range of $1.5 \times 10^{-3}$ to $1.6 \times 10^{-2}$, for example.

The second layer 32 is preferably formed to have a smaller thickness than the thickness of the second n-side semiconductor layer 21. The second layer 32 is formed to have a thickness, for example, in a range of 15 nm to 60 nm.

The second layer 32 is formed such that the thickness of the second layer 32 is, for example, 5 to 60 times the thickness of the first layer 31.

Moreover, the second layer is formed such that the sum of the thicknesses of the first layer 31 and the second layer 32 is, for example, in a range of 20 nm to 50 nm.

In the case of forming a first layer 31 of 1 nm to 3 nm in thickness, the second layer 32 is preferably formed to have a thickness in a range of 20 nm to 45 nm.

Forming Second Light Emission Part

Figure 2E:
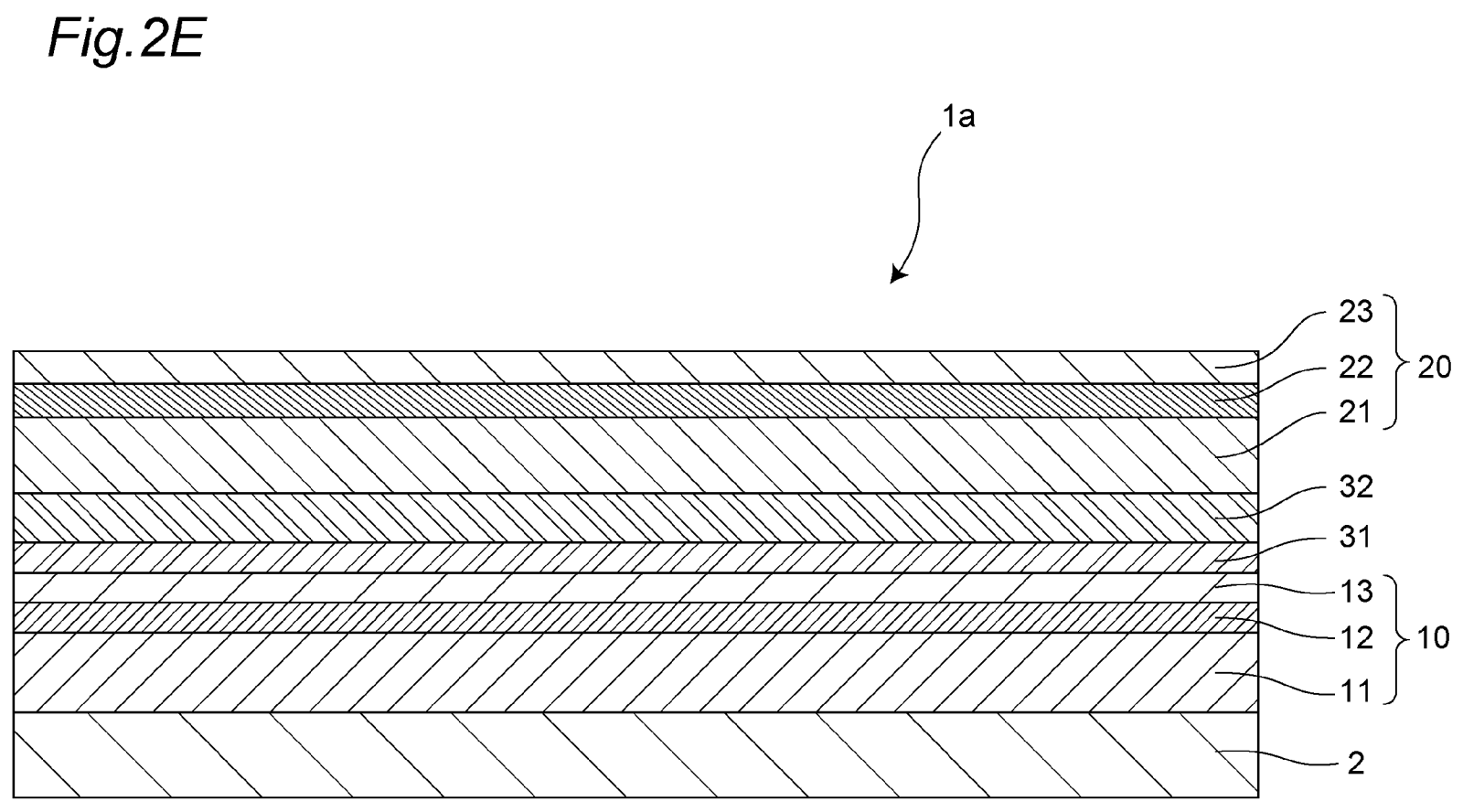

Subsequently, as shown in FIG. 2E, on the second layer 32, a second light emission part 20 is formed.

For the second light emission part 20, a second n-side semiconductor layer 21 is formed on the second layer 32. The second n-side semiconductor layer 21 is formed, for example, by growing an n-type contact layer and an n-type clad layer.

The n-type impurity concentration (third concentration) of the second n-side semiconductor layer 21 is lower than the second concentration, for example, in a range of $1\times10^{18}$ cm$^{-3}$ to $2\times10^{19}$ cm$^{-3}$.

The second n-side semiconductor layer 21 is formed to have a larger thickness than both the first layer 31 and the second layer 32. The thickness of the second n-side semiconductor layer 21 is, for example, in a range of 0.03 μm to 0.2 μm.

Subsequently, a second active layer 22 is formed on the second n-side semiconductor layer 21.

In the case of a second active layer 22 having a multiple quantum well structure, for example, the second active layer 22 can be formed from the second n-side semiconductor layer 21 side by alternately forming barrier layers and well layers as many times as desired. In this case, the process for forming the second active layer 22 is completed with a barrier layer forming process.

Subsequently, for example, by growing a p-type clad layer and a p-type contact layer on the second active layer 22, a second p-side semiconductor layer 23 that successively includes a p-type clad layer and a p-type contact layer from the second active layer 22 side is formed.

In this manner, the second light emission part 20 having a second n-side semiconductor layer 21, a second active layer 22, and a second p-side semiconductor layer 23 is formed on the second layer 32.

By following these processes, a semiconductor stack body 1a that includes a first light emission part 10, a first layer 31, a second layer 32, and a second light emission part 20 is formed on the substrate 2.

Partially Removing Semiconductor Stack Body

Figure 2F:
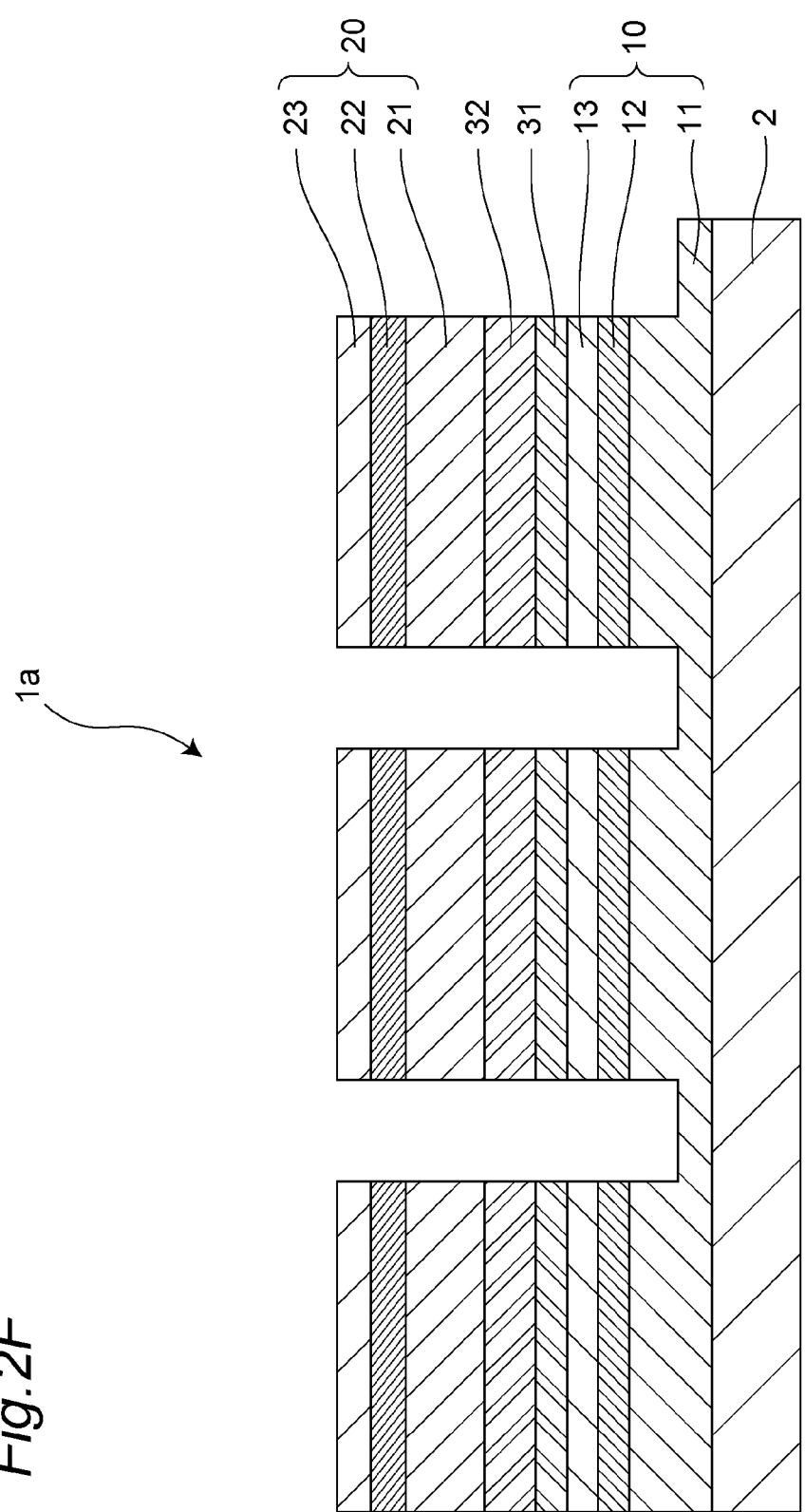
FIG. 2F is a schematic cross-sectional view of a state in the manufacturing process for the nitride semiconductor element shown in FIG. 1.

Subsequently, as shown in FIG. 2F, the n-type contact layer of the first n-side semiconductor layer 11 is exposed by partially removing the second light emission part 20, the second layer 32, the first layer 31, and the first light emission part 10. The partial removal of the semiconductor stack body 1a can be performed, for example, by dry etching such as reactive ion etching.

Forming Conductive Layer

Figure 2G:
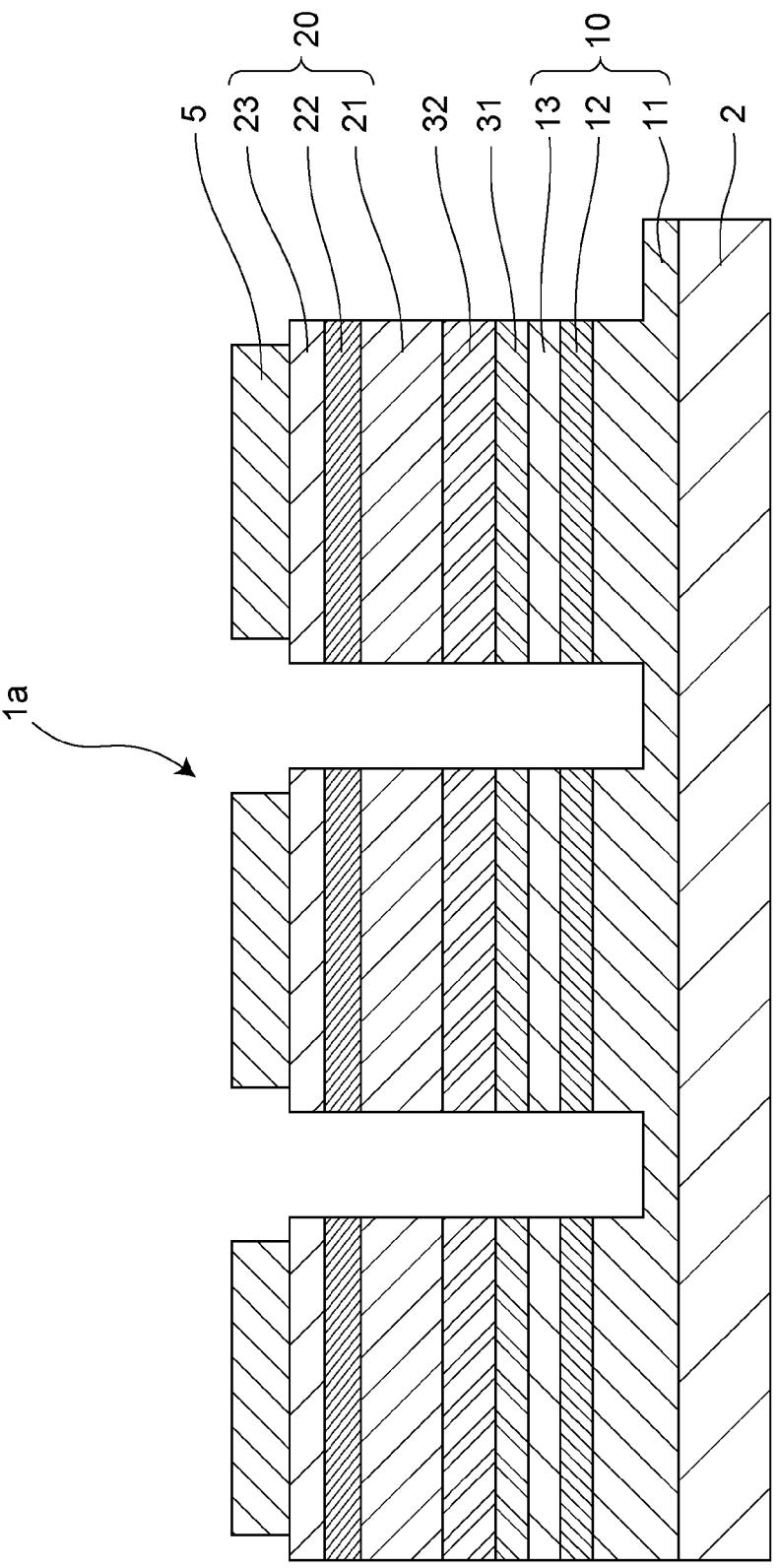
FIG. 2G is a schematic cross-sectional view of a state in the manufacturing process for the nitride semiconductor element shown in FIG. 1.

Subsequently, as shown in FIG. 2G, a conductive layer 5 is formed on the upper face of the second p-side semiconductor layer 23.

The conductive layer 5 can be formed by using a suitable known method. The conductive layer 5, for example, may be formed by patterning a conductive material using a lift-off process. For the conductive member, a metal film or a light transmissive conductive film can be used. The metal film material, for example, is Ag or Al. The light transmissive conductive film material, for example, is ITO (indium tin oxide).

Forming First Electrode and Second Electrode

Figure 2H:
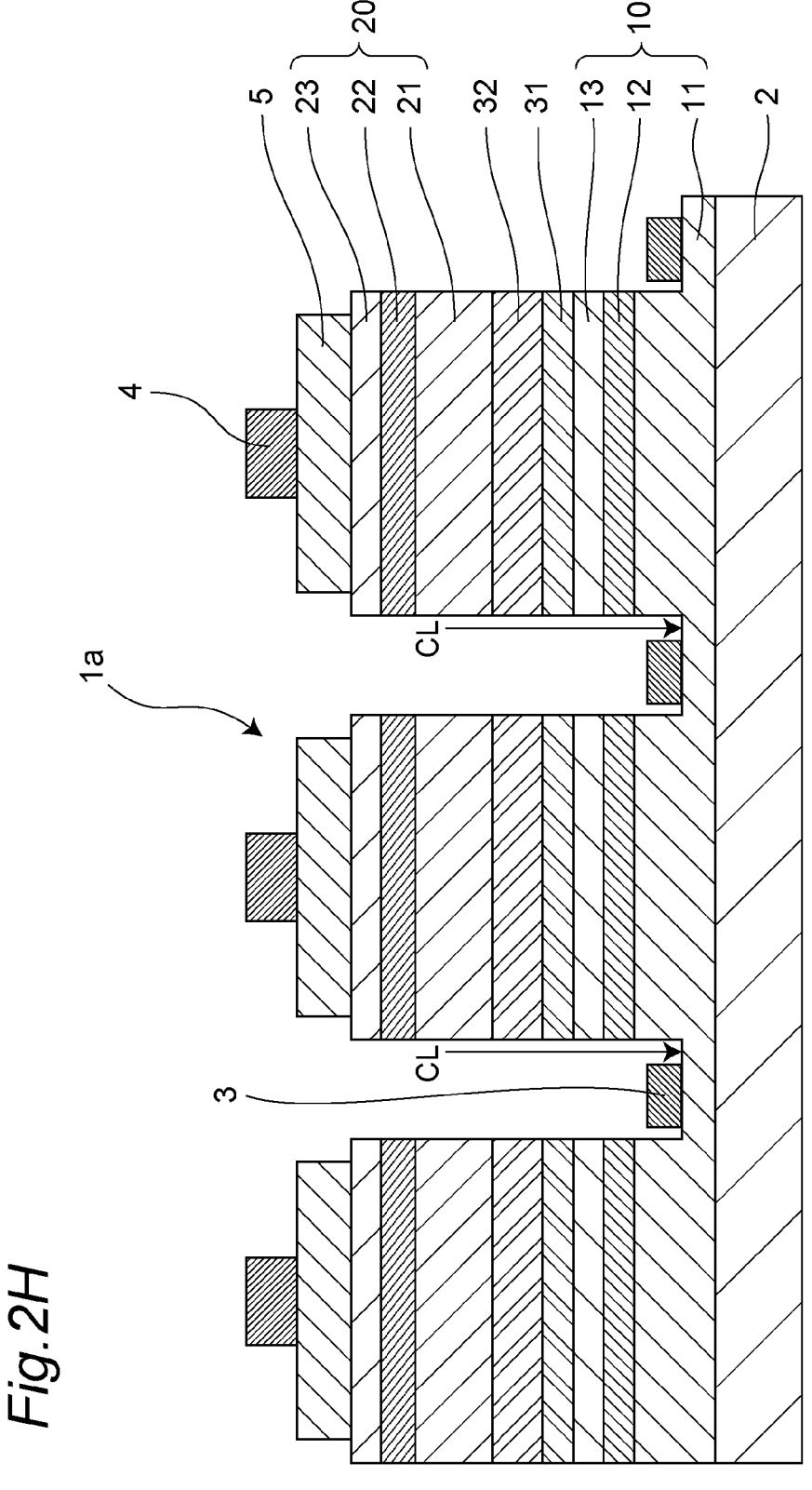
FIG. 2H is a schematic cross-sectional view of a state in the manufacturing process for the nitride semiconductor element shown in FIG. 1.

Subsequently, as shown in FIG. 2H, first electrodes 3 are formed in a predetermined pattern on the upper face of the first n-side semiconductor layer 11, and second electrodes 4 are formed in a predetermined pattern on the upper face of the second p-side semiconductor layer 23. The first electrodes 3 and the second electrodes 4 can be formed by a lift-off process using a resist or etching process in a similar manner to the method for forming the conductive layer 5 described above.

Dividing into Individual Elements

The semiconductor stack body 1a is divided into individual nitride semiconductor elements 100 of a desired size. Dividing is performed along the predetermined positions CL shown in FIG. 2H by, for example, laser scribing or cutting. Laser scribing is a wafer cutting method that uses as the origin a crack extending from a region modified by a laser beam focused within the substrate.

A nitride semiconductor element 100 can be manufactured by the manufacturing method described above.

Variations

A nitride semiconductor element of the embodiment described above has two light emission parts. However, the nitride semiconductor element may have three or more light emission parts. In this case, tunnel junctions are formed, which are each interposed between respective light emission parts, disposing a first layer 31 and a second layer 32 between respective light emission parts. When a nitride semiconductor element 100 includes three or more light emission parts, the wavelengths of the light emitted by all of the light emission parts may be the same or different, or the wavelengths of the light emitted by some of the light emission parts may be the same.

Light Emitting Device

Figure 3:
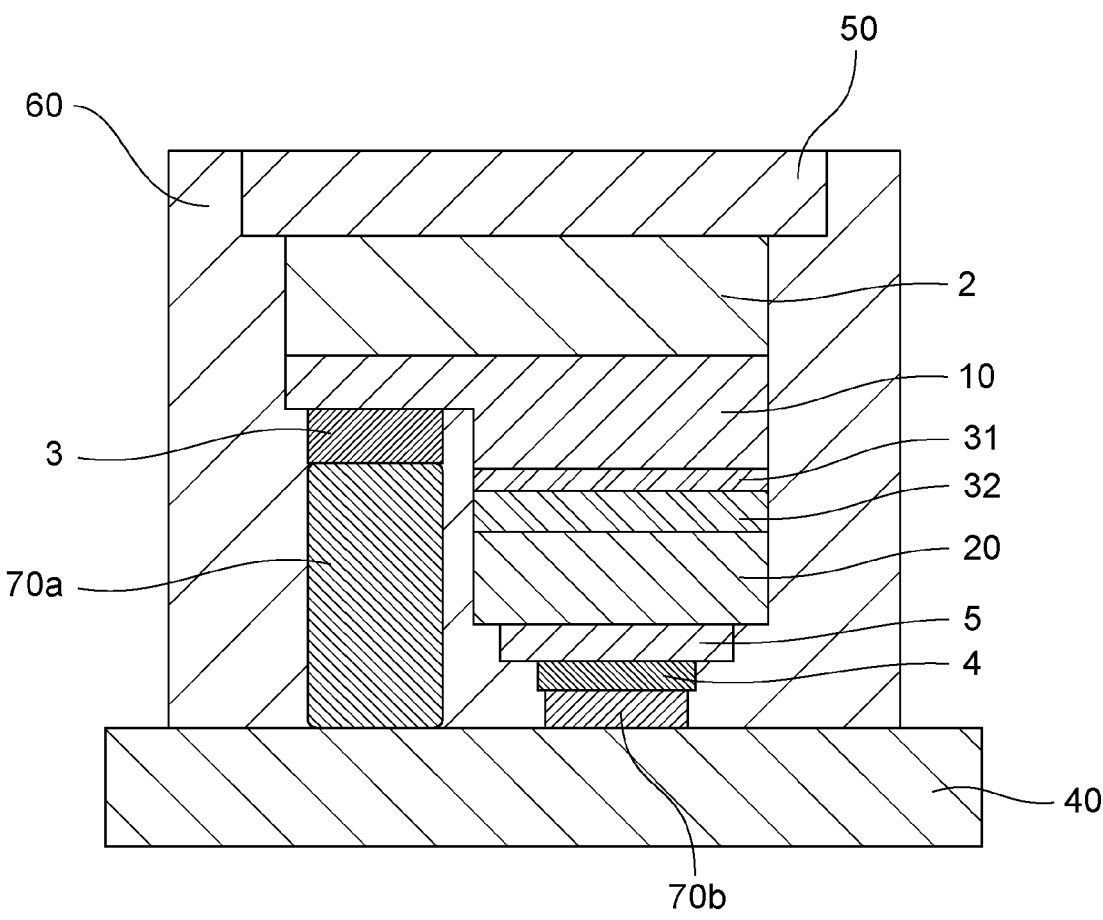
FIG. 3 is a cross-sectional view of a light emitting device that includes a nitride semiconductor element 100 according to an embodiment of the present disclosure.

FIG. 3 is a cross-sectional view of a light emitting device that includes a nitride semiconductor element 100 according to an embodiment of the present disclosure.

The nitride semiconductor element 100 according to the embodiment described above is flip-chip mounted on a wiring electrode formed on a mounting substrate 40. The nitride semiconductor element 100 is flip-chip mounted by connecting the wiring electrode formed on the mounting substrate 40 to the first electrode 3 and the second electrode 4 via connection members 70a and 70b. The connection members 70a and 70b are formed by using bumps, plating, or the like. A wavelength conversion member 50 is disposed on the substrate 2. For the wavelength conversion member 50, for example, a sintered body containing a phosphor can be used. A resin layer 60 having light reflectivity is formed to cover the lateral faces of the nitride semiconductor element 100 and the wavelength conversion member 50. The first light emission part 10 and the second light emission part 20 are exposed at the lateral faces of the nitride semiconductor element 100, and the lateral faces of the first light emission part 10 and the second light emission part 20 are covered by the resin layer 60 as a light emitting device. The resin layer 60 contains particles having a refractive index different from that of the resin layer 60. For such particles, aluminum oxide, titanium oxide, or the like can be used. The light from the nitride semiconductor element 100 is primarily extracted from the upper face of the wavelength conversion member 50 that is exposed from the resin layer 60. The conductive layer 5 that includes a metal film, such as Ag or Al, can reflect the light from the nitride semiconductor element 100. At this time, a portion of the light from the first light emission part 10 and/or the second light emission part 20 is reflected towards the wavelength conversion member 50 by at least one of the conductive layer 5, the first electrode 3, the second electrode 4, the resin layer 60, and the connection members 70*a* and 70*b*.

Example 1

A nitride semiconductor element of Example 1 was produced as described below.

A substrate 2 formed of sapphire was provided, and by growing an n-type contact layer and an n-type clad layer thereon by MOCVD, a first n-side semiconductor layer 11 that included the n-type contact layer and the n-type clad layer successively from the substrate 2 side was formed.

Then on the first n-side semiconductor layer 11, a first active layer 12 was formed that had a multiple quantum well structure emitting light having a peak wavelength at 440 nm.

Subsequently, a first light emission part 10 was completed by forming on the first active layer 12, a first p-side semiconductor layer 13 including a p-type clad layer. Mg was introduced as a p-type impurity into the first p-side semiconductor layer 13.

Then on the first p-side semiconductor layer 13, a first layer 31 formed of GaN and 2 nm in thickness was formed. The thickness here refers to a set thickness of a nitride semiconductor layer to be grown. Si was introduced as an n-type impurity into the first layer 31.

Subsequently, on the first layer 31, a second layer 32 formed of GaN and 28 nm in thickness was formed. Si was introduced as an n-type impurity into the second layer 32.

Subsequently, by growing an n-type contact layer and an n-type clad layer on the second layer 32, a second n-side semiconductor layer 21 that included the n-type contact layer and the n-type clad layer successively from the second layer 32 side was formed. The second n-side semiconductor layer 21 was formed to be 0.08 μm in thickness.

Subsequently, on the second n-side semiconductor layer 21, a second active layer 22 having a multiple quantum well structure emitting light having a peak wavelength at 440 nm was formed.

Then a second light emission part 20 was completed by forming on the second active layer 22, a second p-side semiconductor layer 23 that included a p-type clad layer and a p-type contact layer.

Subsequently, by partially removing the second light emission part 20, the second layer 32, the first layer 31, and the first light emission part 10, a region was created in which the n-type contact layer included in the first n-side semiconductor layer 11 was exposed.

Subsequently, on the second p-side semiconductor layer 23, a conductive layer 5 was formed. On the conductive layer 5, a second electrode 4 was formed. On the first n-side semiconductor layer 11, a first electrode 3 was formed.

By cutting the substrate 2 and the semiconductor stack body 1*a* at predetermined positions, a nitride semiconductor element 100 was produced.

Example 2

A nitride semiconductor element 100 of Example 2 was produced in the same manner as in the nitride semiconductor element 100 of EXAMPLE 1 except for setting the thickness of the first layer 31 as 3 nm and the second layer 32 as 27 nm.

Example 3

A nitride semiconductor element 100 of Example 3 was produced in the same manner as in the nitride semiconductor element 100 of EXAMPLE 1 except for setting the thickness of the first layer 31 as 4 nm and the second layer 32 as 26 nm.

Example 4

A nitride semiconductor element 100 of Example 4 was produced in the same manner as in the nitride semiconductor element 100 of EXAMPLE 1 except for setting the thickness of the first layer 31 as 6 nm and the second layer 32 as 24 nm.

Example 5

A nitride semiconductor element 100 of Example 5 was produced in the same manner as in the nitride semiconductor element 100 of EXAMPLE 1 except for setting the thickness of the second layer 32 as 18 nm.

Example 6

A nitride semiconductor element 100 of Example 6 was produced in the same manner as in the nitride semiconductor element 100 of EXAMPLE 1 except for setting the thickness of the second layer 32 as 43 nm.

Example 7

A nitride semiconductor element 100 of Example 7 was produced in the same manner as in the nitride semiconductor element 100 of EXAMPLE 1 except for setting the thickness of the first layer 31 as 4 nm and the second layer 32 as 56 nm.

Comparative Example 1

A nitride semiconductor element 100 of Comparative Example 1 was produced in the same manner as in the nitride semiconductor element 100 of EXAMPLE 1 except for not disposing a first layer 31 and setting the thickness of the second layer 56 as 30 nm.

Evaluation of Forward Voltage

The electric current of a 28.4 A/cm$^2$ current density was applied to each of the nitride semiconductor elements 100 of Examples 1 to 7 and Comparative Example 1, and the forward voltage Vf (V) was evaluated. Tables 1, 2 and 3 show the results. Because the forward voltage Vf of the Comparative Example 1 exceeded the measurable limit (10.00 V) of the measuring device used, it could not be measured. It is thus entered as ">10" in Table 1.

Evaluation of Light Output

Each of the nitride semiconductor elements 100 of Examples 1 to 7 was installed in a package, and the light output (mW) was evaluated by using an integrating sphere. Tables 1, 2 and 3 show the results.

TABLE 1

| | Thickness of First Layer (nm) | Thickness of Second Layer (nm) | Sum of the Thicknesses of the First and Second Layers | Thickness Ratio of First Layer to Second Layer | Forward Voltage Vf (V) | Light Output (mW) |
|---|---|---|---|---|---|---|
| Example 1 | 2 | 28 | 30 | 1:14 | 7.59 | 441 |
| Example 2 | 3 | 27 | 30 | 1:9 | 7.67 | 435 |
| Example 3 | 4 | 26 | 30 | 1:6.5 | 8.60 | 397 |
| Example 4 | 6 | 24 | 30 | 1:4 | 8.77 | 397 |
| Comparative Example 1 | 0 | 30 | 30 | — | >10 | — |

TABLE 2

| | Thickness of First Layer (nm) | Thickness of Second Layer (nm) | Sum of the Thicknesses of the First and Second Layers | Thickness Ratio of First Layer to Second Layer | Forward Voltage Vf (V) | Light Output (mW) |
|---|---|---|---|---|---|---|
| Example 1 | 2 | 28 | 30 | 1:14 | 7.59 | 441 |
| Example 5 | 2 | 18 | 20 | 1:9 | 7.91 | 419 |
| Example 6 | 2 | 43 | 45 | 1:21.5 | 7.46 | 441 |

TABLE 3

| | Thickness of First Layer (nm) | Thickness of Second Layer (nm) | Sum of the Thicknesses of the First and Second Layers | Thickness Ratio of First Layer to Second Layer | Forward Voltage Vf (V) | Light Output (mW) |
|---|---|---|---|---|---|---|
| Example 1 | 2 | 28 | 30 | 1:14 | 7.59 | 441 |
| Example 6 | 2 | 43 | 45 | 1:21.5 | 7.46 | 441 |
| Example 7 | 4 | 56 | 60 | 1:14 | 7.94 | 369 |

It was confirmed from the results shown in Table 1 that the forward voltage of a nitride semiconductor element 100 can be reduced by forming the first layer 31 and the second layer 32 that has a thickness larger than that of the first layer 31.

It was further confirmed from the results shown in Tables 1 and 2 that Examples 1, 2, 5, and 6 in each of which the thickness of the first layer 31 was 1 nm to 3 nm, and the thickness of the second layer 32 was 15 nm to 50 nm had higher light outputs than the other examples.

Moreover, it was confirmed from the results shown in Tables 1 and 2 that the forward voltage of Examples 1 to 3 and 5 to 6 in each of which the thickness of the second layer 32 was 5 to 60 times the thickness of the first layer 31 decreased as compared to Example 4.

It was confirmed from the results shown in Table 3 that the forward voltage of the nitride semiconductor elements 10 of Examples 1 and 6 in both of which the sum of the thicknesses of the first layer 31 and the second layer 32 fell within the 20 nm to 50 nm range decreased and the light output increased as compared to Example 7.

Surface Flatness of Second Layer

The first layer 31 having a smaller thickness than that of the second layer 32 can result in an improved surface roughness being generated in the crystal face of the second layer as compared to the surface roughness generated in the crystal face of the first layer 31. The two stack bodies described below were provided, and the surface roughness of the crystal face of the second layer 32 was measured. The surface roughness was measured by using an atomic force microscope (AFM). Each of the stack bodies included a first light emission part 10, a first layer 31 formed on the first light emission part 10, and a second layer 32 formed on the first layer 31.

Stack Body A

The stack body A was provided on a substrate 2 formed of sapphire. The stack body A was formed by the same method as in forming the first light emission part 10, the first layer 31, and the second layer 32 in Example 1. However, the thickness of the first layer 31 was 2 nm and the thickness of the second layer 32 was 48 nm.

The surface roughness Ra of the crystal face of the second layer 32 of the stack body A formed as above was measured by using an AFM. The surface roughness Ra was 0.43 nm.

Stack Body B

The stack body B was provided by the same method as in the stack body A except for changing the thickness of the second layer 32 to 2 nm. In other words, the stack body B was provided by setting the thickness of the second layer 32 to be the same as that of the first layer 31.

The surface roughness Ra of the crystal face of the second layer 32 of stack body B formed as above was measured by using an AFM. The surface roughness Ra was 0.83 nm.

The results described above revealed that the stack body A in which the first layer 31 is thinner than that of the second layer 32 had the low surface roughness Ra of the crystal face of the second layer 32 as compared to the stack body B in which the thickness of the second layer 32 was the same as that of the first layer 31. It is inferred from the higher first impurity concentration of the first layer 31 than the second concentration of the second layer 32 as well as the surface roughness measurements of the stack bodies A and B that making the second layer 32 thicker than the first layer 31 tends to improve the surface roughness of the second layer 32 as compared to that of the first layer 31.

SIMS Analysis

Figure 4:
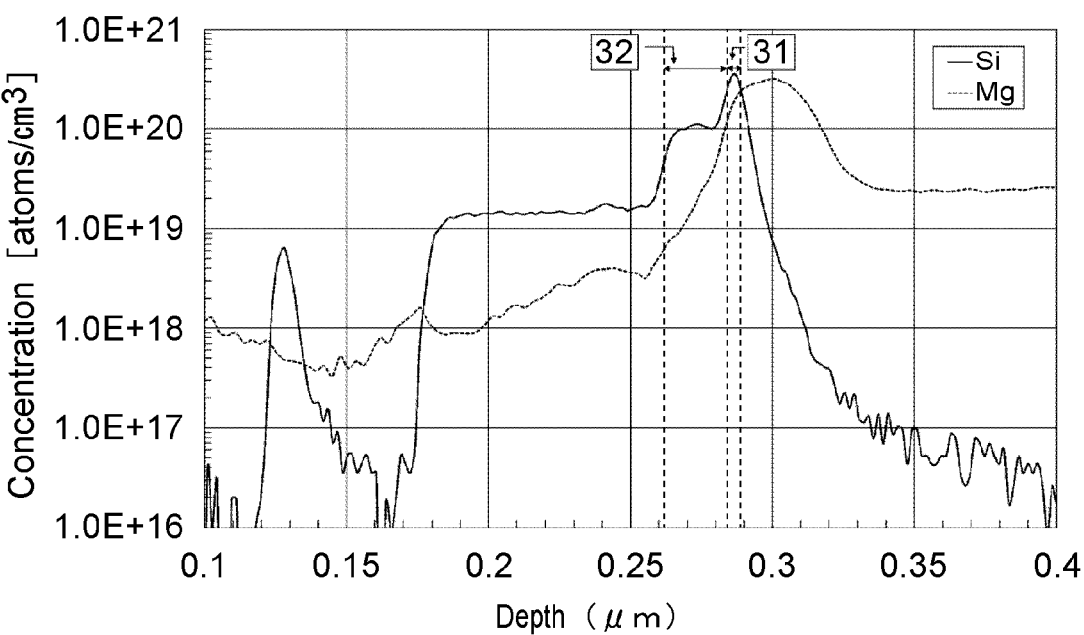
FIG. 4 is a graph showing the results of a SIMS analysis related to Si concentration and Mg concentration.

SIMS analysis was conducted on the nitride semiconductor element 100 provided as below. The nitride semiconductor element 100 analyzed had a sapphire substrate 2, and a plurality of nitride semiconductor layers grown on the substrate by MOCVD. The nitride semiconductor element 100 had: a first light emission part 10 that included a first n-side semiconductor layer 11, a first active layer 12, and a first p-side semiconductor layer 13; a second light emission part 20 that included a second n-side semiconductor layer 21, a second active layer 22, and a second p-side semiconductor layer 23; and a first layer 31 and a second layer 32 positioned between the first light emission part 10 and the second light emission part 20. FIG. 4 is a graph showing the results of the SIMS analysis related to the Si and Mg concentrations. From the Si concentration peak positions and Mg concentration peak positions shown in FIG. 4, the positions of the first layer 31, the second layer 32, and the second n-side semiconductor 21 were estimated. From the SIMS analysis results, it was observed that some areas showing sharp changes in the Si concentration. It was assumed that the vicinity of one of the areas showing sharp changes in the Si concentration was a vicinity of a border of the first layer 31 and the second layer 32, and the vicinity of another one of the areas showing shape changes in the Si concentration was a vicinity of a border of the second layer 32 and the second n-side semiconductor layer 21. FIG. 4 shows ranges that appear to be the first layer 31 and the second layer 32. The borders defining such ranges were each set such that an area whose Si concentration was the maximum was located at the approximately middle portion of this area. The maximum value of the Si concentration of the range that appeared to be the second layer 32 was approximately $1.1 \times 10^{20}$ cm$^{-3}$. It was confirmed that the maximum value of the Si concentration of the range that appeared to be the first layer 31 was greater than the maximum value of the Si concentration of the range that appeared to be the second layer 32. The thickness of the first layer that is estimated by reading the scale on the graph in FIG. 4 was approximately 5 nm to 7 nm. The thickness of the second layer that is estimated by reading the scale on the graph in FIG. 4 was approximately 21 nm. From the SIMS analysis results, it was confirmed that the Si concentration was the highest at the first layer 31 and the lowest at the second n-side semiconductor layer 21 among the first layer 31, the second layer 32, and the second n-side semiconductor layer 21 in the nitride semiconductor element 100.

Certain embodiments, variations, and examples of the present disclosure have been explained above. However, the particulars of the constituents described may vary, and the elements disclosed in the embodiments, variations, and examples can be combined, and the order of arrangements can be changed without deviating from the scope and the spirit of the present invention.

What is claimed is:

1. A method of manufacturing a nitride semiconductor element comprising:

providing a first light emission part comprising a first n-side semiconductor layer, a first active layer formed on the first n-side semiconductor layer, and a first p-side semiconductor layer formed on the first active layer;

forming a first layer on the first p-side semiconductor layer such that the first layer contains an n-type impurity of a first concentration;

forming a second layer on the first layer such that the second layer contains an n-type impurity of a second concentration lower than the first concentration, wherein a thickness of the second layer is greater than a thickness of the first layer; and forming a second light emission part comprising:

a second n-side semiconductor layer formed on the second layer such that the second n-side semiconductor layer contains an n-type impurity of a third concentration lower than the first concentration and the second concentration, a second active layer formed on the second n-side semiconductor layer, and a second p-side semiconductor layer formed on the second active layer.

2. The method of manufacturing a nitride semiconductor element according to claim 1, wherein:

the first concentration is 1.5 times or more and 100 times or less of the maximum value of the second concentration.

3. The method of manufacturing a nitride semiconductor element according to claim 1, wherein:

the first concentration is in a range of $2 \times 10^{20}$ cm$^{-3}$ to $1 \times 10^{22}$ cm$^{-3}$, and the second concentration is in a range of $1 \times 10^{19}$ cm$^{-3}$ to $2 \times 10^{20}$ cm$^{-3}$.

4. The method of manufacturing a nitride semiconductor element according to claim 2, wherein:

the first concentration is in a range of $2 \times 10^{20}$ cm$^{-3}$ to $1 \times 10^{22}$ cm$^{-3}$, and the second concentration is in a range of $1 \times 10^{19}$ cm$^{-3}$ to $2 \times 10^{20}$ cm$^{-3}$.

5. The method of manufacturing a nitride semiconductor element according to claim 1, wherein:

the first concentration is in a range of $2 \times 10^{20}$ cm$^{-3}$ to $5 \times 10^{20}$ cm$^{-3}$, and the second concentration is in a range of $1 \times 10^{19}$ cm$^{-3}$ to $2 \times 10^{20}$ cm$^{-3}$.

6. The method of manufacturing a nitride semiconductor element according to claim 1, wherein:

the thickness of the second layer is in a range of 5 to 60 times the thickness of the first layer.

7. The method of manufacturing a nitride semiconductor element according to claim 2, wherein:

the thickness of the second layer is in a range of 5 to 60 times the thickness of the first layer.

8. The method of manufacturing a nitride semiconductor element according to claim 3, wherein:

the thickness of the second layer is in a range of 5 to 60 times the thickness of the first layer.

9. The method of manufacturing a nitride semiconductor element according to claim 1, wherein:

the thickness of the first layer is in a range of 1 nm to 10 nm.

10. The method of manufacturing a nitride semiconductor element according to claim 2, wherein:

the thickness of the first layer is in a range of 1 nm to 10 nm.

11. The method of manufacturing a nitride semiconductor element according to claim 1, wherein:

the thickness of the second layer is in a range of 15 nm to 60 nm.

12. The method of manufacturing a nitride semiconductor element according to claim 3, wherein:

the thickness of the second layer is in a range of 15 nm to 60 nm.

13. The method of manufacturing a nitride semiconductor element according to claim 8, wherein:

the thickness of the second layer is in a range of 15 nm to 60 nm.

14. The method of manufacturing a nitride semiconductor element according to claim 1, wherein:

a sum of the thickness of the first layer and the thickness of the second layer is in a range of 20 nm to 50 nm.

15. The method of manufacturing a nitride semiconductor element according to claim 8, wherein:

a sum of the thickness of the first layer and the thickness of the second layer is in a range of 20 nm to 50 nm.

16. The method of manufacturing a nitride semiconductor element according to claim 12, wherein:

a sum of the thickness of the first layer and the thickness of the second layer is in a range of 20 nm to 50 nm.

17. The method of manufacturing a nitride semiconductor element according to claim 1, wherein:

the thickness of the first layer is smaller than a thickness of the second n-side semiconductor layer, and the thickness of the second layer is smaller than the thickness of the second n-side semiconductor layer.

18. The method of manufacturing a nitride semiconductor element according to claim 16, wherein:

the thickness of the first layer is smaller than a thickness of the second n-side semiconductor layer, and the thickness of the second layer is smaller than the thickness of the second n-side semiconductor layer.

* * * * *